United States Patent [19]

Niki et al.

[11] Patent Number: 4,887,030

[45] Date of Patent: Dec. 12, 1989

[54] TESTING DEVICE FOR ELECTRICAL CIRCUIT BOARDS

[75] Inventors: Kenichi Niki; Tohru Kokogawa; Akira Ishizu; Hayato Takasago, all of Amagasaki, Japan

[73] Assignee: Mitsubishi Denki Kabushiki Kaisha, Tokyo, Japan

[21] Appl. No.: 117,616

[22] Filed: Nov. 6, 1987

[30] Foreign Application Priority Data

Dec. 12, 1986 [JP] Japan .................................. 61-297073

[51] Int. Cl.⁴ ......................... G01R 31/22; G01R 1/06
[52] U.S. Cl. .............................. 324/158 P; 324/158 F; 324/73 PC; 324/72.5
[58] Field of Search ........... 324/158 P, 158 F, 73 PC, 324/725

[56] References Cited

U.S. PATENT DOCUMENTS

| | | | |
|---|---|---|---|
| 3,458,687 | 7/1969 | Cranch | 324/158 P |
| 3,832,632 | 8/1974 | Ardezzone | 324/158 P X |
| 4,056,777 | 11/1977 | Roch | 324/158 P |
| 4,267,507 | 5/1981 | Guerpont | 324/158 F |
| 4,551,673 | 11/1985 | Barth et al. | 324/158 F |
| 4,560,926 | 12/1985 | Cornu et al. | 324/158 P |
| 4,649,339 | 3/1987 | Grangroth et al. | 324/73 PC |

FOREIGN PATENT DOCUMENTS 0159371  3/1983  German Democratic Rep. ................................ 324/158 P

OTHER PUBLICATIONS

Schuler; "Card Probe", IBM Technical Disclosure Bulletin; vol. 13, No. 11; Apr. 1971; pp. 3488–3489.

Skobern; "Subminiature High Frequency Probe", IBM Technical Disclosure Bulletin; vol. 19, No. 10, Mar. 1977, p. 3678.

"Replaceable Spring Contact Probes", Virginia Panel Corporation, Catalog No. 104; pp. 1–2.

Primary Examiner—Reinhard J. Eisenzopf
Assistant Examiner—Vinh P. Nguyen
Attorney, Agent, or Firm—Fleit, Jacobson, Cohn, Price, Holman & Stern

[57] ABSTRACT

In a testing device for testing electric circuit board having test terminals on the board parallel to each other, conductor strips are arranged in conformity with the test terminals, and a pressing member is provided for pressing the conductor strips on the test terminals.

2 Claims, 7 Drawing Sheets

FRIOR ART

FRIOR ART

TESTING DEVICE FOR ELECTRICAL CIRCUIT BOARDS

BACKGROUND OF THE INVENTION

The present invention relates to a testing device, particularly a probing assembly for an electrical circuit board suitable for testing disconnection, short-circuiting, leakage or the like by means of contact with test terminals on the circuit board.

Examples of the testing devices of similar types are shown in FIG. 1 and FIG. 2. The example shown in FIG. 1 is similar to those shown in a catalogue of Shonan Enginering Company, a catalogue of Nippon Denshin Company, a catalogue of Seiken Company. The example shown in FIG. 2 is similar to those shown in a catalogue of Nippon Micronics Company, a catalogue of Kyowa Riken Company, a catalogue of Hugle Electronics Company.

The device of FIG. 1 comprises spring-loaded probe pins 1, leads 2 electrically connecting the probe pins 1 to an external measurement circuit, and an insulating board 3 for mounting the probe pins 1. The probe pins 1 are provided in number and pitch corresponding to test terminals 5 on an electrical circuit board 4 on which the test should be performed. Although only two probe pins 1 and two test terminals 5 are illustrated, there are usually a lot more of them. The probe pins 1 are aligned with the test terminals 5 and are pressed against the test terminals 5. This is done by movement of the board 3 or the board 4 toward the other. The springs built in the probe pins 1 serves to ensure good contact while avoiding excessive contact pressure. When the electrical connection between the probe pins 1 and the test terminals 5 are achieved, disconnection, short-circuiting, leak current or the like can be tested by means of the external measurement circuit connected via the leads 2.

The device of FIG. 2 comprises a tapered strip shaped probe pins 6, leads 7 for connecting the probe pins 6 to an external measurement circuit, an insulating board 8 for mounting the probe pins 6. The parts of the strip-shaped probe pins extending parallel to the circuit board 4 serves as a leaf spring to ensure good contact between the probe pins 6 and test terminals 5 on the board 4.

The devices shown in FIGS. 1 and 2 have limitations in that they cannot be formed to achieve simultaneous contact with a large number of test terminals 5 arranged at a short pitch. For instance a liquid crystal display panel may have 300 test terminals arranged at a pitch of 0.3 mm which must be contacted simultaneously for efficient testing. Moreover, the probe pins 1 and 6 of the devices shown in FIGS. 1 and 2 are made of metal and have sharp tips. When the sharp tips engage with the test terminals 5, the test terminals 5 may be damaged which may cause defects after the test (e.g., breakage or peel-off under heat).

SUMMARY OF THE INVENTION

An object of the invention is to provide a testing device for an electrical circuit board which can achieve simultaneous contact with a large number of test terminals arranged at a short pitch, and to minimize the risk of the test terminals being damaged by the contact.

According to the invention, there is provided a testing device for testing an electric circuit board having test terminals on the board parallel to each other, the testing device comprising
conductor strips arranged in conformity with the test terminals, and
a pressing member for pressing the conductor strips on the test terminals.

DETAILED DESCRIPTION OF THE EMBODIMENTS

Figure 1:
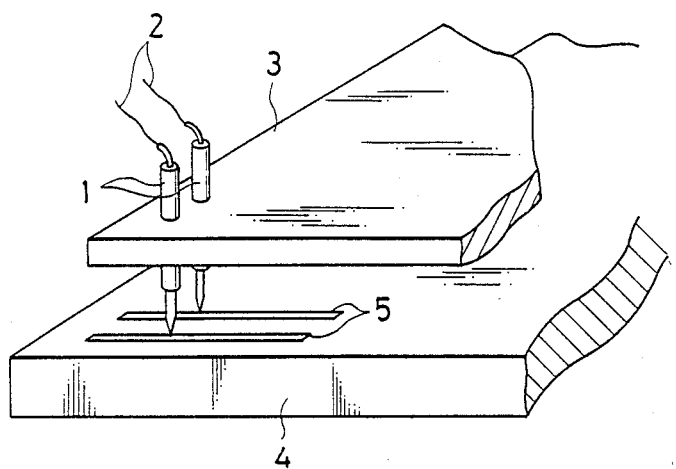
FIG. 1 and FIG. 2 are perspective views showing testing devices in the prior art.
Figure 2:
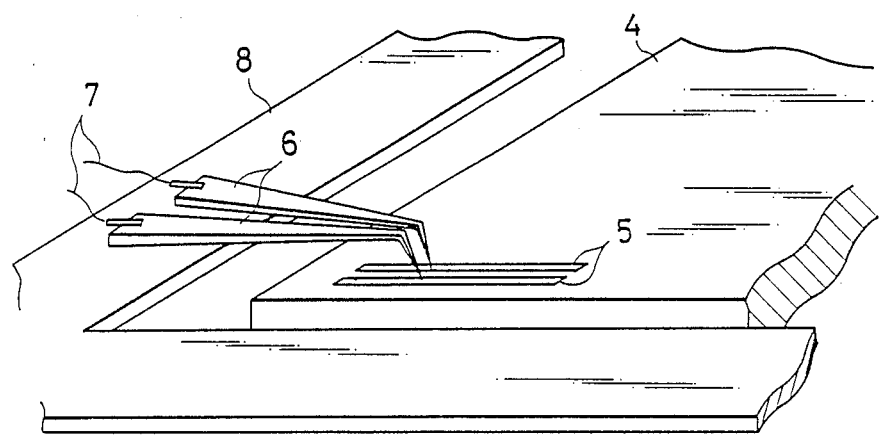
Figure 3:
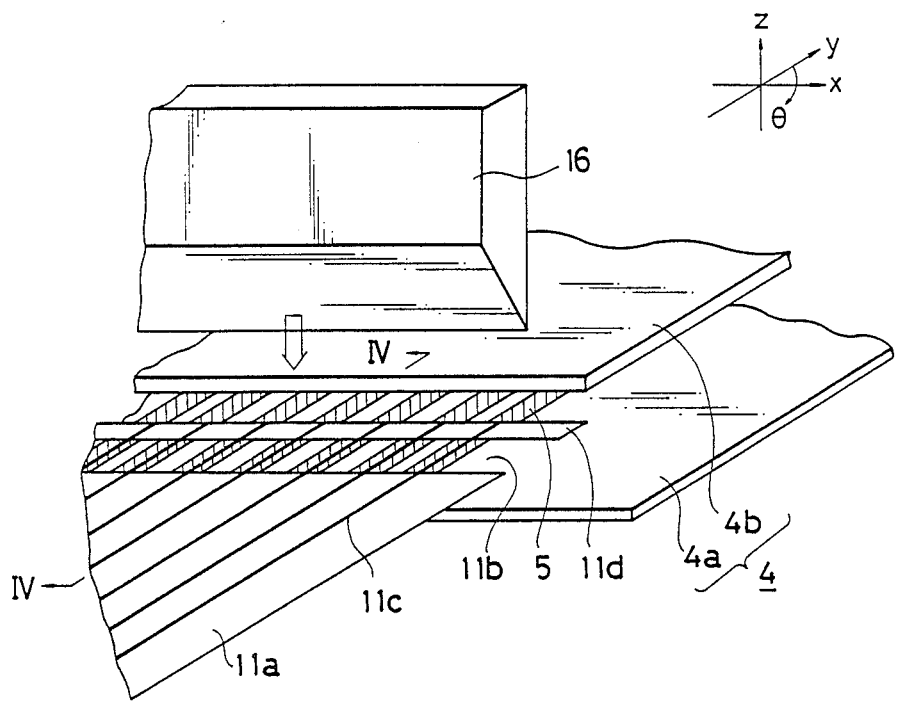
FIG. 3 is a perspective view showing a testing device of an embodiment of the invention.
Figure 4:
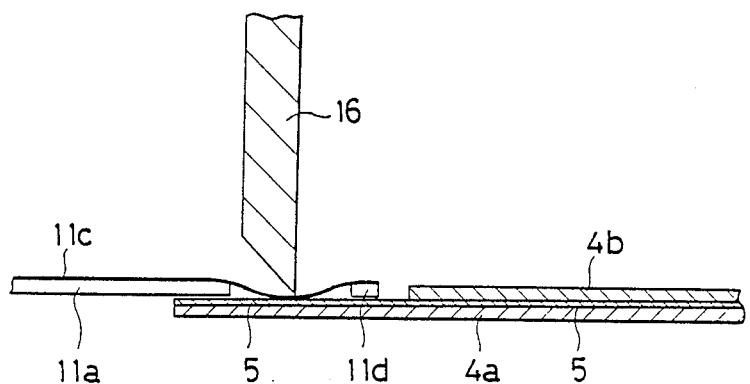
FIG. 4 is a sectional view along line IV—IV in FIG. 3.

FIGS. 3 and 4 show an embodiment of the invention. The testing device of this embodiment is designed for testing a liquid crystal display panel 4 formed of boards 4a and 4b having straight test terminals 5 parallel to each other. The testing device comprises a base sheet 11a of for instance polyimide film, conductor strips 11c formed on the base sheet 11a. The conductor strips 11c conform in pitch and disposition to the test terminals 5 on the panel 4. The conductor strips 11c project from one end of the base sheet 11a and are supported at their ends by a support sheet 11d disposed at a predetermined distance from said one end of the base sheet 11a to form a gap 11b between them. The support sheet 11d can also be formed of polyimide film. The base sheet 11a with the conductor strips 11c mounted thereon is flexible.

A pressing member 16 is formed of an elastic material such as urethane rubber and is shaped to have a tapered, sharp edge at its lower end.

To carry out the test, the conductor strips 11c projecting from the end of the base sheet 11a are aligned or registered with the test terminals 5 of the panel 4. During this alignment, it is possible for the operator to observe the test terminals 5 below the conductor strips 11c through the gap 11b. The alignment is therefore facilitated. Then a pressing member 16 is pressed on the conductor strips 11 in the gap 11b so that the conductor strips 11 are in pressure-contact with the test terminals 5. In this state various electrical signals can be exchanged through the contacts, so that electrical tests can be performed.

Figure 5:
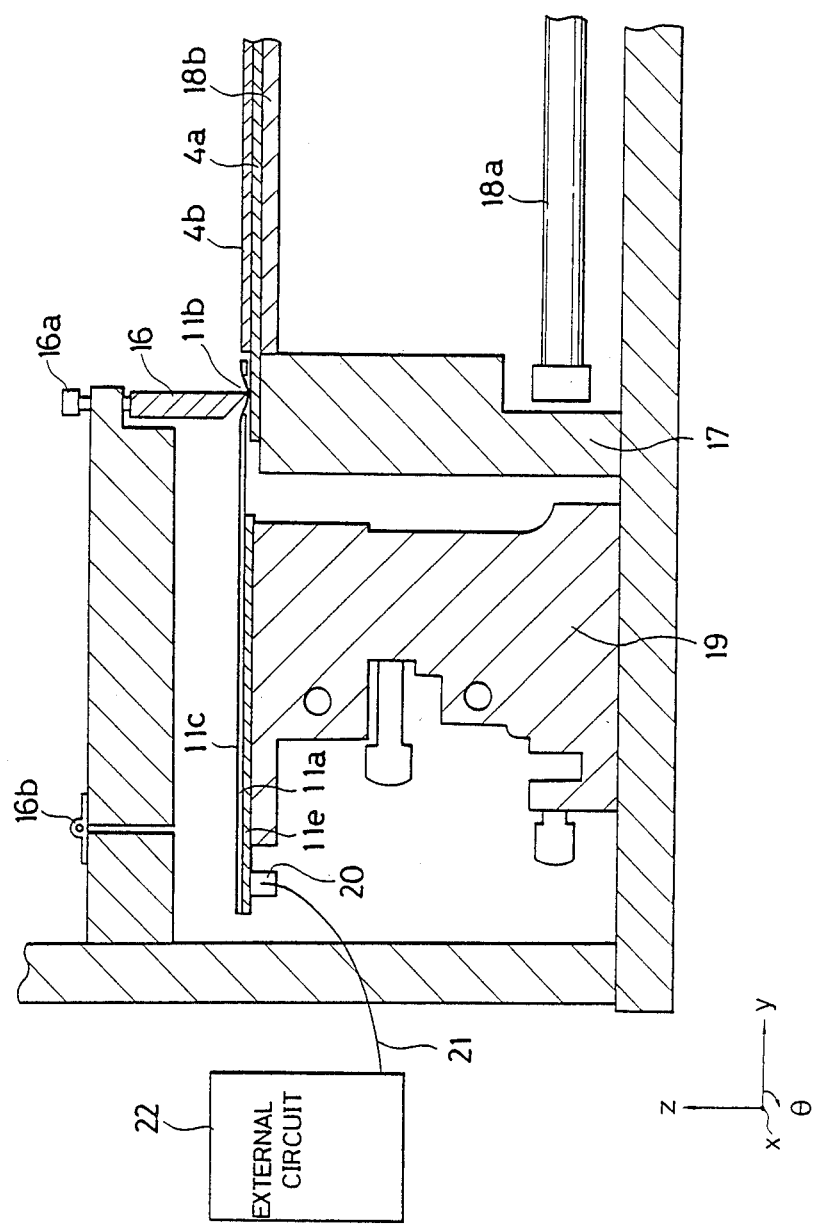
FIG. 5 is a sectional view showing an arrangement incorporating the testing device according to the invention.

A specific example of application of the abovedescribed testing device is shown in FIG. 5. In this application, there are a pair of electric circuit boards 4a, 4b forming a liquid crystal display panel. The boards 4a, 4b are disposed on a table 17 below which an illuminating device comprising a fluorescent lamp 18 and a light diffusion panel 18b are provided to illuminate the liquid crystal display panel from below. A flexible insulating sheet comprising a base sheet 11a and conductor strips 11c is provided with a reinforcement non-flexible substrate 11e of glass-epoxy or the like. The assembly of the flexible insulating sheet and the non-flexible reinforcement substrate 11e is fixed to a positioning mechanism 19 capable of adjusting its position in x-direction, y-direction, z-direction and a-direction (orientation). The flexible insulating sheet is also provided with a connector 20 which is connected to an external circuit 22 which is either a resistance measurement instrument having a scanner function or a driver circuit for the panel tested. A pressing member 16 can be moved up and down by a screw 16a, and can be moved away from the gap 11b by means of a hinge 16b having a lock mechanism.

Although the test terminals of the panel being tested are not clearly depicted, they are assumed to be connected in the same manner as in FIG. 4.

In the illustrated arrangement, first the pressing member 16 is positioned away from the gap 11b. In this state, a positioning device 19 is manipulated to register the flexible insulating sheet with respect to the boards 4a, 4b to be tested, during which a microscope or the like can be used for the observation from the above for confirmation of the registration. When the registration is attained, the pressing member 16 is moved to a position above the gab 11b and the screw 16a is turned to press the pressing member 16 on the conductor strips 11c until the conductor strips 11c are brought into contact with the test ends.

When the external circuit 22 is a resistance measurement instrument having a scanner function, disconnection, short-circuiting and the like of the wiring in the panels 4a, 4b are tested. When the external circuit 22 is a driver circuit for the boards 4a, 4b to be tested, the fluorescent lamp 18a is turned on and the panels 4a, 4b are made to display an image of test patterns or the like in accordance with the drive signals and the displayed image is observed to test the characteristics of the boards 4a, 4b.

Figure 6:
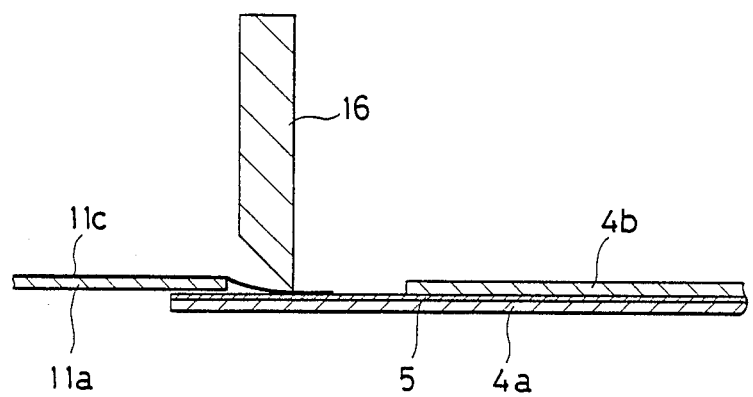
FIG. 6 is a sectional view showing a modification of the embodiment of FIG. 3.

In the above embodiment, a support base sheet 11d is used to support the ends of the conductor strips so that the spacings between ends of adjacent conductor strips are maintained at desired values. But the support base sheet 11d can be omitted, as shown in FIG. 6.

The conductor strips 11c, or at least those parts thereof contacting with the test terminals, may be plated with gold. The contact resistance can then be reduced and the reliability of the electrical connection can be improved.

In the above embodiment, the conductor strips 11c are disposed on the upper surface of the base sheet 11a.

The conductor strips 11c may alternatively be formed on the lower surface of the base sheet 11a. The conductor strips may also be covered with a cover film.

In the above embodiment, the conductor strips 11c are in contact with one of the four sides of the board 4a or 4b being tested. It can be so arranged that conductor strips are in contact with more than one side of each panel at the same time.

In the above embodiments, the conductor strips are disposed in conformity with test terminals of the electric circuit board to be tested. After the former are positioned in alignment with the latter, a resilient pressing member having a convex end is used to press the former on the latter. Damage to the test terminals can be minimized, while at the same time electrical connection between them is ensured. The device of the invention permits quick testing of an electric circuit board having a large number of test terminals arranged at a short pitch. That is, even where a large number of (e.g., 300), test terminals are arranged at a short pitch (e.g., 0.3 mm), such as in a liquid crystal display panel, all the test terminals can be contacted by the testing device simultaneously. This is advantageous. For instance when the circuit board to be tested is a liquid crystal display panel, all the display cells can be turned on simultaneously, so that disconnection, short-circuiting or the like of the electric circuit can be tested at once. Moreover, it is possible to put the liquid crystal panel in the same condition as in practical use. Evaluation of various characteristics such as aging can be made and defective boards can be detected before assembling the board with other components. Accordingly, yield of the completed products can be improved.

Moreover, as the conductor strips project from the end of the base sheet, registration of the conductor strips with the test terminals of the board is facilitated.

Figure 7:
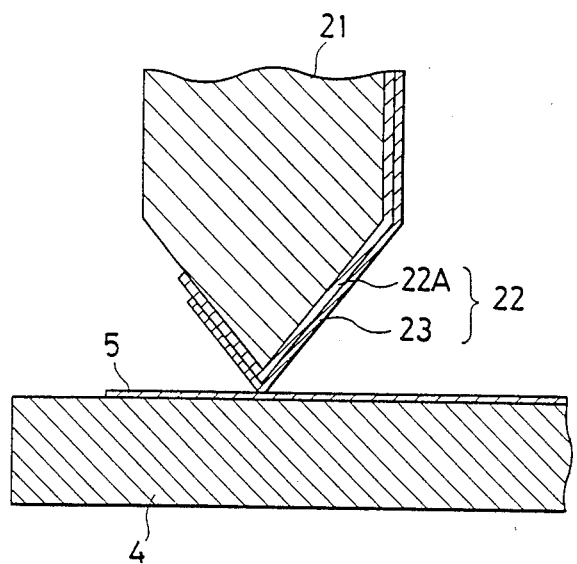
FIG. 7 is a sectional view showing a further embodiment of the invention.
Figure 8:
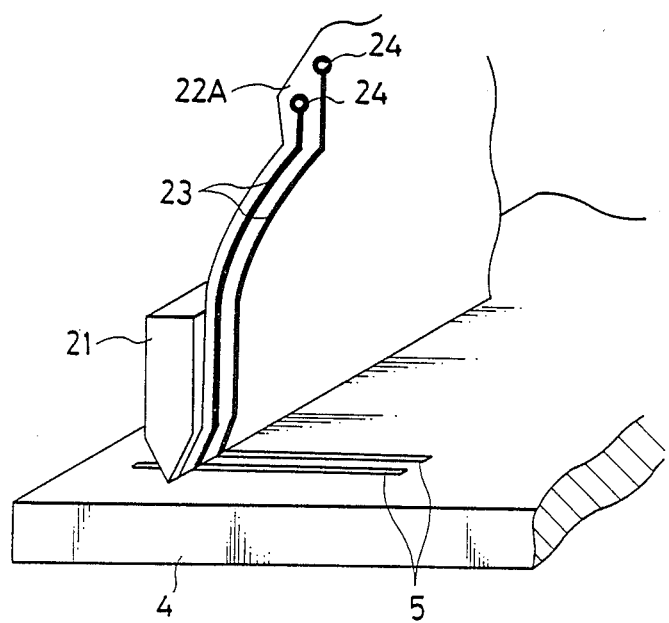
FIG. 8 is a perspective view showing the testing device of the embodiment of FIG. 7.

FIGS. 7 and 8 show another embodiment of the invention. In the figures, 21 is an elastic substrate of rubber or the like. A flexible insulating sheet 22 of polyimide or the like is fixed to the substrate 21. The flexible insulating sheet 22 is similar to the flexible insulating sheet 11 of the embodiment of FIG. 3 but its conductor strips 23 do not project from the end of the base sheet 22A. The substrate 21 is movable up and down and it thus has the function of the pressing member 16 of the embodiment of FIG. 3. The conductor strips 23 can be formed for example by first sticking by an adhesive a copper foil to the base sheet 22A and then etching the copper foil into the desired pattern. The pads 24 at the ends of the conductor strips 23 are connected via a connector to an external circuit such as a measuring circuit not shown.

To carry out a test, the conductor strips 23 are registered with the test terminals 5 on the circuit board 4 and the pressing member 21 is lowered until the conductor strips 21 are pressed on the test terminals 5. The conductor strips 23 are projecting from the surface of the sheet 22A by its thickness (e.g., 18 to 70 microns). The test terminals 5 also project from the surface of the board 4 by its thickness. As a result, it is ensured that the conductor strips 23 and the test terminals 5 are in contact with each other to achieve electrical connection when the insulating sheet is pressed. With the use of the elastic member for the pressing member 21, the contact between the conductor strips 23 and the test terminals 5 are even more ensured.

The pads 24 at the ends of the conductor strips 23 are connected via the connector to a measurement circuit by which disconnection, short-circuiting, leak current and the like in the circuit board 4 are detected.

In the above embodiment, the substrate 21 is made of rubber. But the material can be other than rubber. It can also be other than elastic material. It can be metal if its edge can be made to the dimension precisely. In this case the weight of the metalic substrate 21 can be utilized to provide part of the pressure for the pressing between the conductor strips and the test terminals. Use of a metallic substrate 21 is also advantageous in that deterioration by deformation is small. A still further alternative material of the substrate member is plastic.

In the above embodiment, conductor strips 23 are secured to the insulating sheet 22 which in turn is fixed to the substrate 21. In an alternative arrangement, the conductor strips 23 are directly secured to the substrate 21.

Figure 9:
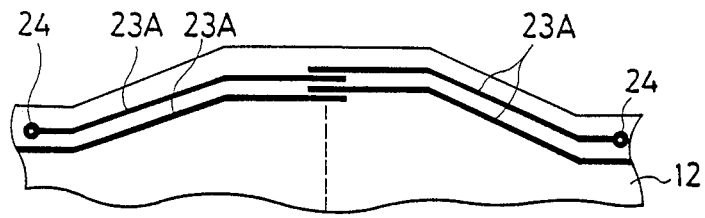
FIG. 9 is a developed view of the insulating sheet according to a further embodiment of the invention.
Figure 10:
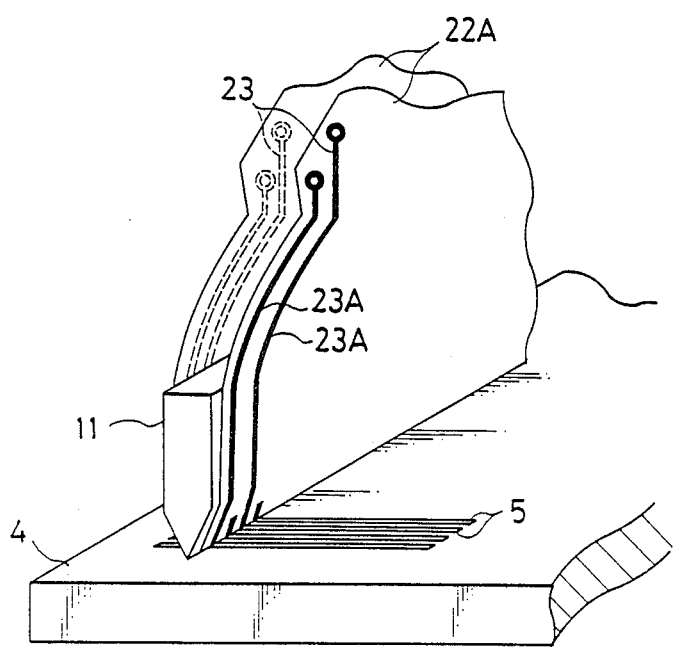
FIG. 10 is a perspective view of the embodiment of FIG. 9.

In a further modification shown in FIGS. 9 and 10, the conductor strips are extended alternately to opposite sides of the substrate that is, the leads 23A of the conductor strips 23 adjacent to each other are extended to opposite sides and pads 24 are provided at respective ends of such leads 23A. In this embodiment, the pitch of the leads and the pitch of the pads on the respective sides are twice that of the conductor strips at the contacting part, i. e., at the tip of the substrate. This facilitates connection with connectors even where the pitch of the strip conductors at the contacting part is reduced. The arrangement is therefore advantageous for contact with test terminals with shorter intervals.

In the above embodiment, the conductor strips are made of copper foil. The conductor strips may be plated with gold to restrain oxidation or corrosion.

What is claimed is:

1. A testing device for testing an electric circuit board having test terminals thereon parallel to each other, the testing device comprising:
    a resilient wedge shaped pressing member having first and second opposite facing planar sides, and a pressing edge formed at the tapered termination of said first and second opposite planar sides of said pressing member,
    a flexible, insulative base sheet including a first face region having conductor strips etched thereon in a pattern corresponding to the test terminals on said electric circuit board, said first face region being in contact with said pressing edge of said pressing member for effecting contact between said conductor strips on said first face region and said test terminals, said flexible sheet having second and third face regions in contact with said first and second planar sides, respectively, of said pressing member, said first face region being located between said second and third face regions, said conductor strips extending to outer peripheral edges on said second and third face regions of said base sheet, and wherein spacing between adjacent conductor strips in said second and third face regions of said base sheet is at least twice as large as the spacing between adjacent conductor strips in said first face region of said base sheet.

2. The testing device according to claim 1, wherein the conductor strips are made of copper and at least part of the conductor strips contacting the test terminals are plated with gold.

* * * * *